(12) United States Patent
Ahn et al.

(10) Patent No.: US 7,183,149 B2
(45) Date of Patent: Feb. 27, 2007

(54) METHOD OF MANUFACTURING FIELD EFFECT TRANSISTOR

(75) Inventors: Ho Kyun Ahn, Daejeon (KR); Jong Won Lim, Daejeon (KR); Hong Gu Ji, Daejeon (KR); Woo Jin Chang, Daejeon (KR); Jae Kyoung Mun, Daejeon (KR); Hae Cheon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 62 days.

(21) Appl. No.: 11/180,726

(22) Filed: Jul. 14, 2005

(65) Prior Publication Data

US 2006/0121658 A1    Jun. 8, 2006

(30) Foreign Application Priority Data

Dec. 2, 2004    (KR) ............... 10-2004-0100421

(51) Int. Cl.
*H01L 21/338*    (2006.01)
(52) U.S. Cl. ............... 438/167; 438/179; 438/182
(58) Field of Classification Search ........ 438/167, 438/179, 182
See application file for complete search history.

(56) References Cited

U.S. PATENT DOCUMENTS 6,670,652 B2    12/2003    Song
7,084,021 B2 *    8/2006    Janke ............... 438/167

FOREIGN PATENT DOCUMENTS

KR    1020000018552    4/2000
KR    10-0276077    9/2000

* cited by examiner

*Primary Examiner*—Jack Chen
(74) *Attorney, Agent, or Firm*—Mayer Brown Rowe & Maw LLP

(57) ABSTRACT

Provided is a method of manufacturing a field effect transistor (FET). The method includes steps of: forming an ohmic metal layer on a substrate in source and drain regions; sequentially forming an insulating layer and a multilayered resist layer on the entire surface of the resultant structure and simultaneously forming resist patterns having respectively different shapes in both a first region excluding the ohmic metal layer and a second region excluding the ohmic metal layer, wherein a lowermost resist pattern is exposed in the first region, and the insulating layer is exposed in the second region; exposing the substrate and the insulating layer by simultaneously etching the exposed insulating layer and the exposed lowermost resist pattern using the resist patterns as etch masks, respectively; performing a recess process on the exposed substrate and etching the exposed insulating layer to expose the substrate; and forming gate recess regions having different etching depths from each other over the substrate, depositing a predetermined gate metal, and removing the resist patterns. In this method, transistors having different threshold voltages can be manufactured without additional mask patterns using the least number of processes, with the results that the cost of production can be reduced and the stability and productivity of semiconductor devices can be improved.

12 Claims, 4 Drawing Sheets

METHOD OF MANUFACTURING FIELD EFFECT TRANSISTOR

CROSS-REFERENCE TO RELATED APPLICATION

This application claims priority to and the benefit of Korean Patent Application No. 2004-100421, filed Dec. 2, 2004, the disclosure of which is incorporated herein by reference in its entirety.

BACKGROUND

1. Field of the Invention

The present invention relates to a method of manufacturing a field effect transistor (FET) and, more specifically, to a method of manufacturing an FET, in which transistors having respectively different threshold voltages are simultaneously manufactured on a single substrate through a lithography process using a multilayered resist layer and a dry etching process using an etch selectivity of the resist layer with respect to an insulating layer. In this method, the transistors having respectively different threshold voltages can be manufactured without any additional mask pattern, thus reducing the number of processes to be performed and the cost of production.

2. Discussion of Related Art

In general, semiconductor devices, such as a high electron mobility transistor (HEMT) using a compound semiconductor and a metal semiconductor field effect transistor (MESFET), have been manufactured using an ohmic metal layer, which is obtained by sequentially depositing an AuGe layer, a Ni layer, and an Au layer to a predetermined thickness.

In the manufacture of these semiconductor devices, such as the HEMT using the compound semiconductor and the MESFET, a gate recess process, which is the most important process, is typically performed by measuring currents and includes at least one of a dry process, a wet process, and a combination thereof.

The gate recess process is performed using $BCl_3$ gas or $SF_6$ gas in a dry etching system, such as an electron cyclotron resonance (ECR) system or an inductive coupled plasma (ICP) system. Also, the gate recess process may be carried out using a variety of wet etchants, for example, an $H_3PO_4$-based solution with a mixture of $H_3PO_4$, $H_2O_2$, and $H_2O$ in an appropriate ratio.

Further, the manufacture of the semiconductor devices, such as the HEMT using the compound semiconductor and the MESFET, includes forming a gate electrode by sequentially depositing, for example, a Ti layer, a Pt layer, and an Au layer, to a predetermined thickness.

In the above-described conventional manufacture of the semiconductor devices, when transistors having respectively different threshold voltages are simultaneously formed on a single substrate, separate mask patterns are required. Thus, subsequent processes including a gate recess process should be separately performed.

For example, given a HEMT device using a compound semiconductor substrate (e.g., a GaAs substrate, an InP substrate, or a GaN substrate), the manufacture of an enhancement mode FET (E-FET) and a depletion mode FET (D-FET) on the same substrate at the same time requires not only separately performing lithography processes using masks or electron-beam (e-beam) lithography processes, but also separately performing subsequent gate recess processes, so that gate recess regions having respectively different etching depths can be obtained.

Accordingly, when the E-FET and the D-FET are manufactured on the same substrate at the same time, the conventional method leads to an increase in the cost of production with a great number of processes and a drop in productivity.

SUMMARY OF THE INVENTION

The present invention is directed to a method of manufacturing a field effect transistor (FET), in which transistors having respectively different threshold voltages are simultaneously manufactured on a single substrate using a lithography process using a multilayered resist layer and a dry etching process using an etch selectivity of the resist layer with respect to an insulating layer, so that when transistors having different modes or threshold voltages are manufactured on the same substrate, the number of additional lithography processes and their subsequent processes decreases. As a result, the cost of production can be reduced and the stability and productivity of semiconductor devices can be enhanced.

One aspect of the present invention is to provide a method of manufacturing a FET including steps of: forming an ohmic metal layer on a substrate in source and drain regions; sequentially forming an insulating layer and a multilayered resist layer on the entire surface of the resultant structure and simultaneously forming resist patterns having respectively different shapes in both a first region excluding the ohmic metal layer and a second region excluding the ohmic metal layer, wherein the insulating layer is exposed in the first region, and a lowermost resist pattern is exposed in the second region; exposing the substrate and the insulating layer by simultaneously etching the exposed insulating layer and the exposed lowermost resist pattern using the resist patterns as etch masks, respectively; performing a recess process on the exposed substrate and etching the exposed insulating layer to expose the substrate; and forming gate recess regions having different etching depths from each other over the substrate, depositing a predetermined gate metal, and removing the resist patterns.

Herein, the step of forming the ohmic metal layer may further include a step of sequentially forming an active layer and a capping layer each having a predetermined thickness between the substrate and the ohmic metal layer.

Also, the step of forming the ohmic metal layer may include steps of defining the source and drain region using resist patterns; depositing a predetermined ohmic metal; and annealing the ohmic metal using a rapid thermal annealing (RTA) process.

The thickness of the insulating layer may depend on an etch rate of the multilayered resist layer and the height of a leg portion of a T-shaped gate.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIGS. 1A through 1I are cross sectional views illustrating a method of manufacturing a field effect transistor (FET) according to an exemplary embodiment of the present invention.

Figure 1A:
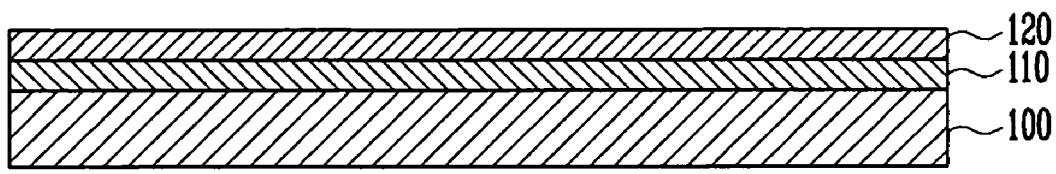
FIGS. 1A to 1I are cross sectional views illustrating a method of manufacturing a field effect transistor (FET) according to an exemplary embodiment of the present invention.

Referring to FIG. 1A, an active layer 110 and a capping layer 120 are sequentially formed on a substrate 100 to predetermined thicknesses, respectively. The substrate 100 may be any kind of semiconductor substrate and one of a semiconductor substrate such as a Si substrate and a Ge substrate, a compound semiconductor substrate such as a SiGe substrate, a SiC substrate, a GeAs substrate, and an InGaAs substrate, and an insulating substrate such as a glass substrate, a sapphire substrate, a quartz substrate, and a resin substrate.

Figure 1B:
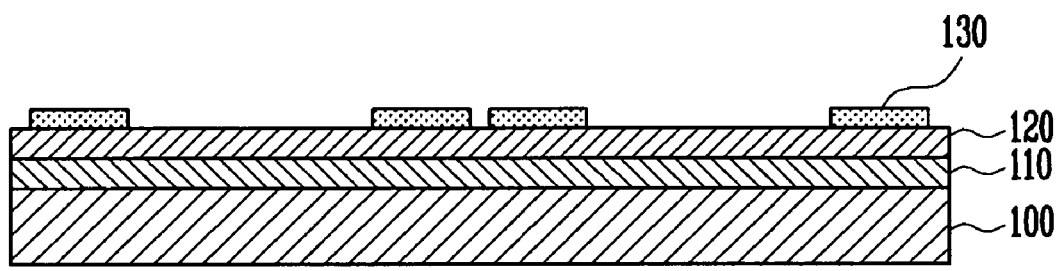

Referring to FIG. 1B, a region where source and drain regions (i.e., source and drain ohmic metal layers 130) will be formed is defined on the capping layer 120 using a resist pattern (not shown), and a predetermined ohmic metal is deposited thereon. After that, the resultant structure is annealed using a rapid thermal annealing (RTA) process, thereby forming source and drain ohmic metal layers 130 on the capping layer 120 over the substrate 100.

For instance, during the manufacture of a semiconductor device, such as a HEMT using a compound semiconductor or a MESFET, a metal layer, which is obtained by depositing an AuGe layer, a Ni layer, and an Au layer to a predetermined thickness, may be used as the predetermined ohmic metal and annealed using the RTA process so as to form the source and drain ohmic metal layers 130.

Meanwhile, although it is described in the present embodiment that the source and drain ohmic metal layers 130 are formed on the capping layer 120, the present invention is not limited thereto. That is, the source and drain ohmic metal layers 130 may be formed directly on the substrate 100. Also, the active layer 110 and the capping layer 120 may not be formed if required.

Figure 1C:
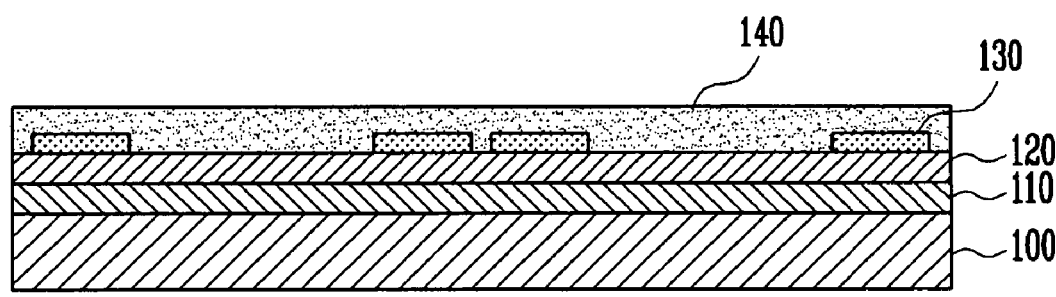

Referring to FIG. 1C, an insulating layer 140 is deposited on the entire surface of the resultant structure to a predetermined thickness. In this case, the insulating layer 140 may be formed of, for example, silicon nitride or silicon oxide, and serves to protect the surface of a compound semiconductor substrate.

Also, the thickness of the insulating layer 140 may be determined considering the etch rate of a resist layer and the height of a leg portion of a T-shaped gate.

Figure 1D:
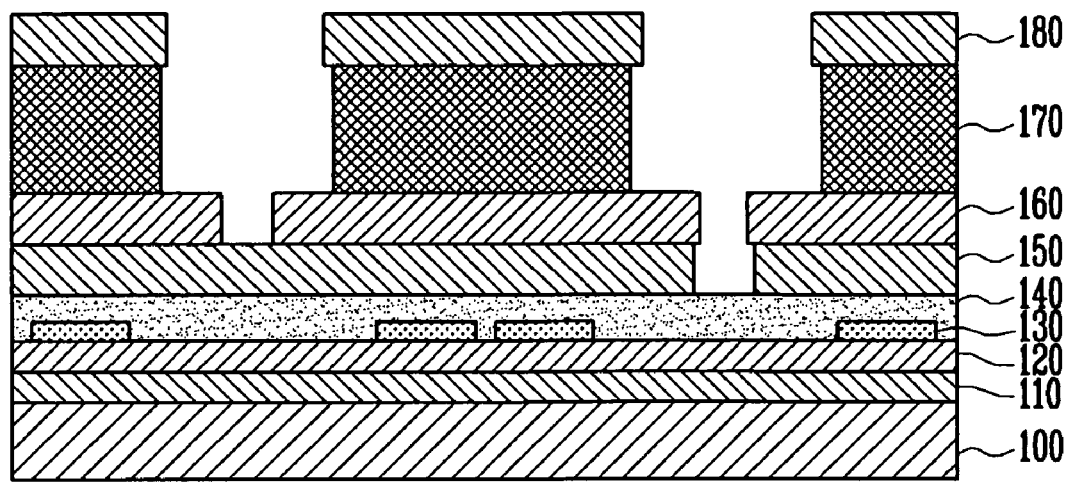

Referring to FIG. 1D, a plurality of resist layers are sequentially coated on the insulating layer 140 to form a multilayered resist layer. Then, first through fourth resist patterns 150, 160, 170, and 180 are formed to have different shapes depending on whether or not a lowermost resist layer is developed.

For example, when HEMTs having different modes or threshold voltages are manufactured using an e-beam lithography process, the multilayered resist layer may be a combination of various resists, such as methyl methacrylate and methacrylic acid(co-polymer)/poly methyl methacrylate (PMMA)/co-polymer/PMMA or co-polymer/ZEP/poly-dimethylgutarimide (PMGI)/ZEP.

The first resist pattern 150, which is a lowermost pattern, needs to have an appropriate etch rate such that it can be etched together during an etch process of the insulating layer 140 deposited on the substrate 100 to expose the substrate 100. In this case, the lowermost first resist pattern 150 may be selectively defined in order to obtain the transistors having respectively different modes or threshold voltages.

For instance, when an enhancement mode HEMT (E-HEMT) having a T-shaped gate and a depletion mode HEMT (D-HEMT) having a T-shaped gate are simultaneously manufactured using a multilayered resist layer formed of co-polymer/PMMA/co-polymer/PMMA, an e-beam lithography process is performed such that all the resist patterns including the lowermost first resist pattern 150 (i.e., co-polymer) are defined to manufacture the E-HEMT, whereas only other resist patterns excluding the lowermost first resist pattern 150 (i.e., co-polymer) are defined to manufacture the D-HEMT.

Specifically, an exposure process is performed in an appropriate dose and a developing process is performed so that head regions of the T-shaped gates are defined in gate regions of the E-HEMT and the D-HEMT, respectively. Thereafter, an additional exposure process is performed in different doses and an additional developing process is performed so that leg regions of the T-shaped gates are defined to different depths in the gate regions of the E-HEMT and the D-HEMT, respectively.

In other words, when the leg regions of the T-shaped gates are defined, the resist patterns for the E-HEMT are exposed in a relatively large dose so that even the first resist pattern 150 (i.e., co-polymer) can be defined during the developing process. On the other hand, the resist patterns for the D-HEMT are exposed in a relatively small dose so that the first resist pattern 150 (i.e., co-polymer) is not defined during the developing process.

Figure 1E:
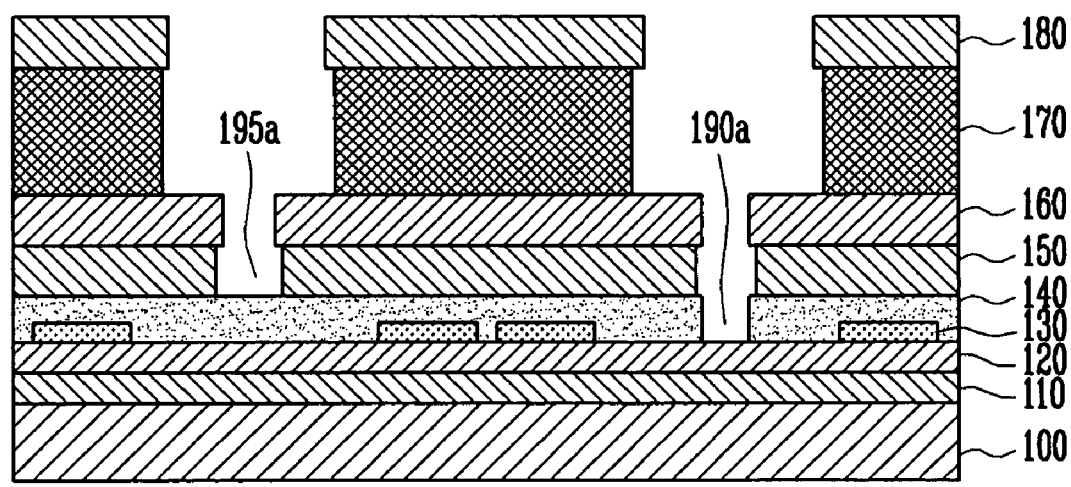

Referring to FIG. 1E, the insulating layer 140, which is exposed by the first through fourth resist patterns 150, 160, 170, and 180, is anisotropically dry etched, thereby forming a first opening region 190a over the substrate 100 to expose the capping layer 120.

While the insulating layer 140 is being dry etched, in the resist patterns for the D-HEMT, the first resist pattern 150 (i.e., co-polymer), which is the exposed lowermost pattern, is also etched to the same size as the leg region of the T-shaped gate defined by the second resist pattern 160 (i.e., PMMA), thereby forming an opening region 195a in the first resist pattern 150 to expose the insulating layer 140.

In this case, in order to protect the semiconductor surface from plasma after the dry etching process of the insulating layer 140, a portion of the insulating layer 140 is dry etched, and the remaining portions thereof are isotropically wet etched using, for example, a buffered oxide etch (BOE) solution.

Also, in the resist patterns for the D-HEMT, the kinds and thicknesses of the lowermost first resist pattern 150 (i.e., co-polymer) and the insulating layer 140 should be selected in consideration of an etch selectivity of the first resist pattern 150 with respect to the insulating layer 140 during the anisotropic dry etching of the insulating layer 140, such that the lowermost first resist pattern 150 is completely etched.

Meanwhile, the anisotropic etching process of the insulating layer 140 may be performed using $CF_4$ gas, a mixture of $CF_4$ gas and $CHF_3$ gas, or a mixture of $CF_4$ gas and $O_2$ by means of a reactive ion etching (RIE) system, a magnetically enhanced reactive ion etching (MERIE) system, or an inductive coupled plasma (ICP) system, etc.

Figure 1F:
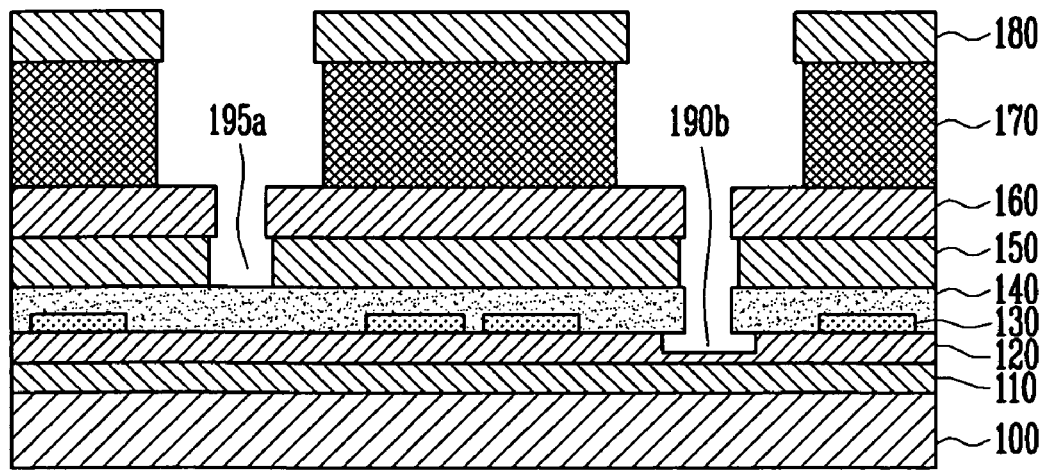

Referring to FIG. 1F, a first recess process is performed on the resist patterns for the E-HEMT. Thus, the exposed capping layer 120 formed on the substrate 100 is etched to a predetermined thickness so that a first gate recess region 190b is formed in the capping layer 120.

In this case, because the insulating layer 140 is exposed by the resist patterns for the D-HEMT over the substrate 100, it is not etched during the first recess process.

Figure 1G:
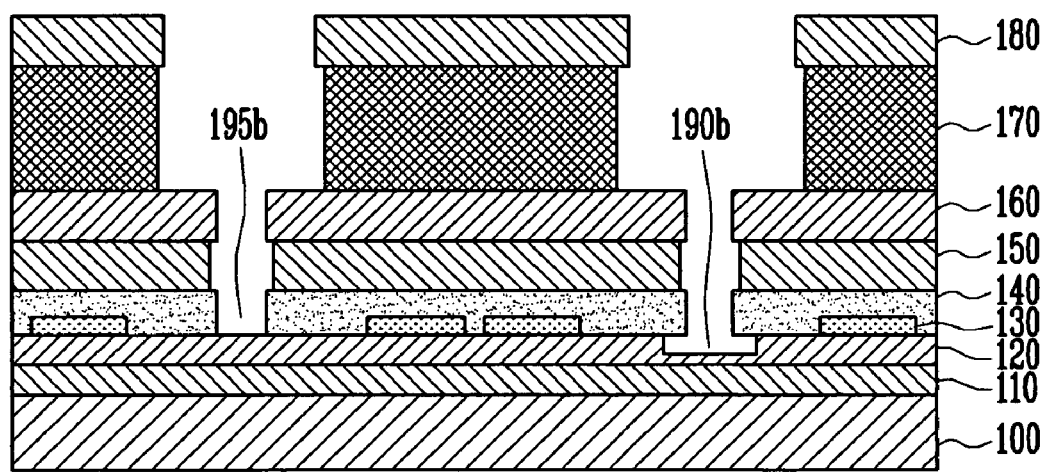

Referring to FIG. 1G, the insulating layer 140, which is exposed by the opening region 195a formed in the first resist pattern 150, is etched using, for example, a BOE solution or an RIE process. Thus, a second opening region 195b is formed over the substrate 100 such that the capping layer 120 formed on the substrate 100 is exposed also by the resist patterns for the D-HEMT.

During this process, in order to protect the semiconductor surface exposed by the resist patterns for the E-HEMT from plasma, the insulating layer 140 may be etched using, for example, the BOE solution.

Figure 1H:
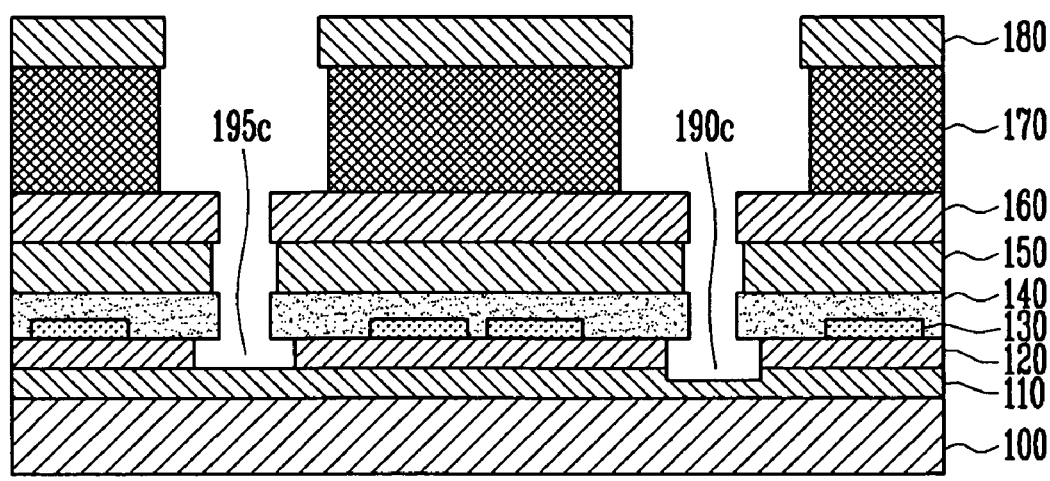

Referring to FIG. 1H, a second recess process is performed to etch the active layer 110 and the capping layer 120 formed on the substrate 100. As a result, the first through fourth resist patterns 150, 160, 170, and 180 used for the E-HEMT and the D-HEMT have different etching depths from each other.

In other words, the capping layer 120 is etched to expose the active layer 110 in the gate region of one transistor, while the active layer 110 is etched to a predetermined thickness in the other transistor.

Figure 1I:
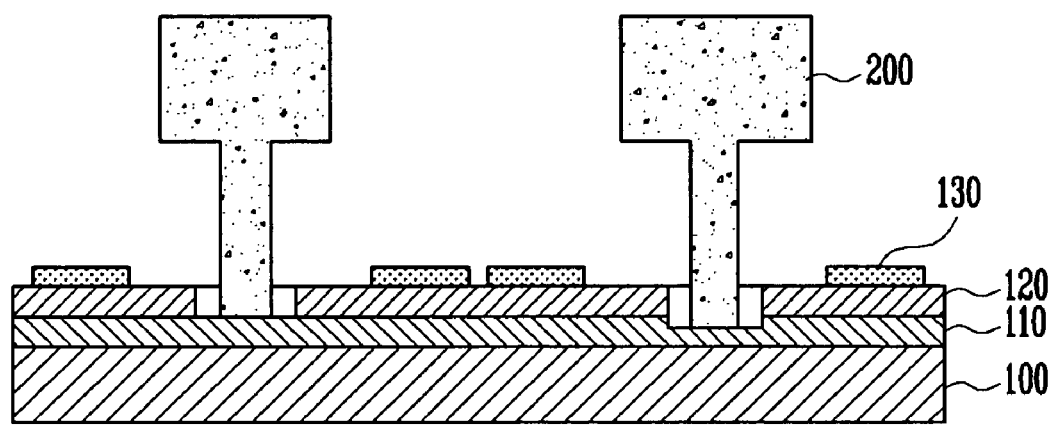

Referring to FIG. 1I, for example, in order to manufacture HEMTs, a gate metal 200 obtained by sequentially depositing a Ti layer, a Pt layer, and an Au layer is deposited in the gate regions defined by the first through fourth resist patterns 150, 160, 170, and 180. Thereafter, a lift-off process is conducted, thereby removing the first through fourth resist patterns 150, 160, 170, and 180. Hence, T-shaped gate electrodes are formed such that transistors having different modes or threshold voltages can be manufactured.

According to the present invention, transistors having different threshold voltages are simultaneously manufactured on a substrate through a lithography process using a multilayered resist layer and a dry etching process using an etch selectivity of the resist layer with respect to an insulating layer. In conclusion, transistors having different modes or threshold voltages can be manufactured on the same substrate without additional mask patterns, with the result that the cost of production can be reduced and the stability and productivity of semiconductor devices can be enhanced.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A method of manufacturing a field effect transistor, comprising steps of:
   (a) forming an ohmic metal layer on a substrate in source and drain regions;
   (b) sequentially forming an insulating layer and a multi-layered resist layer on the entire surface of the resultant structure and simultaneously forming resist patterns having respectively different shapes in both a first region excluding the ohmic metal layer and a second region excluding the ohmic metal layer, wherein the insulating layer is exposed in the first region, and a lowermost resist pattern is exposed in the second region;
   (c) exposing the substrate and the insulating layer by simultaneously etching the exposed insulating layer and the exposed lowermost resist pattern using the resist patterns as etch masks, respectively;
   (d) performing a recess process on the exposed substrate and etching the exposed insulating layer to expose the substrate; and
   (e) forming gate recess regions having different etching depths from each other over the substrate, depositing a predetermined gate metal, and removing the resist patterns.

2. The method according to claim 1, wherein the step (a) comprises a step of sequentially forming an active layer and a capping layer each having a predetermined thickness between the substrate and the ohmic metal layer.

3. The method according to claim 1, wherein the step (a) comprises steps of:
   defining the source and drain region using resist patterns;
   depositing a predetermined ohmic metal; and
   annealing the ohmic metal using a rapid thermal annealing process.

4. The method according to claim 1, wherein in the step (b), the thickness of the insulating layer depends on an etch rate of the resist layer and the height of a leg portion of a T-shaped gate.

5. The method according to claim 1, wherein in the step (b), the multilayered resist layer is formed of one of methyl methacrylate and methacrylic acid(co-polymer)/poly methyl methacrylate(PMMA)/co-polymer/PMMA or co-polymer/ZEP/poly-dimethylglutarimide (PMGI)/ZEP.

6. The method according to claim 1, wherein the step (b) comprises steps of:
   (b-1) defining head regions of T-shaped gates in separate gate regions, respectively, by exposing and developing the multilayered resist layer in an appropriate dose; and
   (b-2) defining leg regions of the T-shaped gates to expose the insulating layer and the lowermost resist layer, respectively, by exposing and developing the separate gate regions in different doses.

7. The method according to claim 6, wherein the step (b-2) comprises steps of:
   exposing the resist patterns in a first gate region in a relatively large dose such that the lowermost resist pattern in the first gate region is defined during a developing process to expose the insulating layer; and
   exposing the resist patterns in a second gate region in a relatively small dose such that the lowermost resist pattern is not defined during the developing process.

8. The method according to claim 1, wherein in the step (b), the resist patterns are exposed in different doses so that the resist patterns have different shapes depending on whether or not the lowermost resist pattern is formed.

9. The method according to claim 1, wherein the step (c) comprises steps of:
   etching a portion of the insulating layer using a dry etching process; and
   etching the remaining portions of the insulating layer through an isotropic wet etching process using a buffered oxide etch (BOE) solution.

10. The method according to claim 9, wherein the dry etching process is performed by one selected from the group consisting of a reactive ion etching (RIE) system, a magnetically enhanced reactive ion etching (MERIE) system, and an inductive coupled plasma (ICP) system.

11. The method according to claim 10, wherein the dry etching process is performed using one selected from the group consisting of $CF_4$ gas, a mixture of $CF_4$ gas and $CHF_3$ gas, and a mixture of $CF_4$ gas and $O_2$.

12. The method according to claim 1, wherein in the step (e), the gate recess regions having the respectively different etching depths are formed using a recess process, and the resist patterns are removed using a lift-off process.

* * * * *